(12) United States Patent
Lee

(10) Patent No.: US 7,671,282 B2
(45) Date of Patent: Mar. 2, 2010

(54) STRUCTURE OF A CIRCUIT BOARD FOR IMPROVING THE PERFORMANCE OF ROUTING TRACES

(75) Inventor: Sheng-Yuan Lee, Hsin Tien (TW)

(73) Assignee: Via Technologies, Inc., Hsin Tien, Taipei Hsien (TW)

( * ) Notice: Subject to any disclaimer, the term of this patent is extended or adjusted under 35 U.S.C. 154(b) by 405 days.

(21) Appl. No.: 10/843,466

(22) Filed: May 12, 2004

(65) Prior Publication Data

US 2005/0178583 A1 Aug. 18, 2005

(30) Foreign Application Priority Data

Feb. 17, 2004 (TW) .............................. 93103822 A

(51) Int. Cl.
*H05K 1/11* (2006.01)
(52) U.S. Cl. .................. 174/262; 174/255; 174/256; 174/261; 361/794
(58) Field of Classification Search ......... 174/255–256, 174/261, 262; 361/793, 794, 749, 795, 763, 361/780
See application file for complete search history.

(56) References Cited

U.S. PATENT DOCUMENTS 3,961,296 A 6/1976 Wiggenhorn

| | | | |
|---|---|---|---|
| 6,184,478 B1* | 2/2001 | Imano et al. ................. | 174/261 |
| 6,658,732 B2* | 12/2003 | Doberenz ..................... | 29/846 |
| 6,717,059 B2* | 4/2004 | Shintani et al. ............. | 174/251 |
| 6,796,028 B2* | 9/2004 | Ahmad ......................... | 29/852 |
| 6,800,814 B2* | 10/2004 | Ohsaka ........................ | 174/255 |
| 6,803,252 B2* | 10/2004 | Lao et al. ..................... | 438/106 |
| 6,809,267 B1* | 10/2004 | Kurita et al. ................. | 174/254 |
| 2003/0091911 A1* | 5/2003 | Noelscher ....................... | 430/5 |
| 2005/0183883 A1* | 8/2005 | Bois et al. .................... | 174/255 |
| 2006/0065432 A1* | 3/2006 | Kawauchi et al. ........... | 174/254 |

* cited by examiner

*Primary Examiner*—Dean A. Reichard
*Assistant Examiner*—Abiy Getachew
(74) *Attorney, Agent, or Firm*—Birch, Stewart, Kolasch & Birch, LLP

(57) ABSTRACT

A structure of a circuit board for improving the performance of routing traces is described as eliminating the resonant effects from the inner layers in a circuit board. For eliminating the stray capacitor effect between the planes in the circuit board, the present invention uses a method for etching an area of a power plane and the area is corresponding to a routing plane. Consequently, the routing trace can make good electric potential reference of a ground plane. Due to the reduction of the stray capacitor, the structure for improving the performance of routing traces of the invention can avoid the resonance effect and parasitic resonance in the circuit board as produced in a high-frequency situation in order to promote the quality of the circuit board.

12 Claims, 7 Drawing Sheets

STRUCTURE OF A CIRCUIT BOARD FOR IMPROVING THE PERFORMANCE OF ROUTING TRACES

This Non-provisional application claims priority under 35 U.S.C. §119(a) on Patent Application No(s). 93103822 filed in Taiwan on Feb. 17, 2004, the entire contents of which are hereby incorporated by reference.

BACKGROUND OF THE INVENTION

1. Field of the Invention

The present invention relates to a structure of a circuit board with an etching hole or slot in the power plane for eliminating the resonance effect and parasitic resonance on each trace.

2. Description of Related Art

A printed circuit board (PCB) is a circuit system with some specific functions and connected to a plurality of electronic elements like those in the telecommunications, high-frequency circuits, communication systems, aviation, ships, appliances, cars, machines and all kinds of instruments. For the technique advancement of IC, in which more conducting pins are required, the more complicated routing traces are also needed. As a result, the design of the circuit board is more complicated and concentrated, and a multi-layer circuit board with area reduction is in development.

The method for manufacturing the conventional PCB is to press a plurality of layers with different functions, including at least a power plane, an element plane, a signal plane, a ground plane and some interposed insulator layers. As the number of IC elements mounted on a PCB increases, these IC elements can be considered an element of equivalent resistance. The problem of voltage variation may occur when the current passes through the IC to induce a voltage drop. Therefore, a technique of plane routing is in development for promoting the efficiency in a PCB.

Nevertheless, since the distance of separation between the dielectric layer and the routing plane, power plane and ground plane is very narrow, a bad resonance effect and parasitic resonance is brought out. FIG. 1 shows the cross-sectional view of a multi-layer PCB in prior art, in which PCB 10 is formed with a multi-layer structure including a first routing plane 11 and a second routing plane 16 with the surface-mounted devices set thereon. There are even one or a plurality of inner routing planes 14 installed inside the PCB 10 if the area of surface routing plane is insufficient. Moreover, a first ground plane 12, a second ground plane 15 and a power plane 13 supply power to PCB 10.

In other words, the planes installed in the circuit board or the PCB can be treated as the parallel planes of a capacitor. The conducting planes and the decoupling paths therebetween can be equivalent to an inductance. Therefore the smaller the distance of separation between each plane is, the more violent the inductance-capacitance (LC) resonance will be. An example is given with the ground plane 12 and the power plane 13. The negative effect of a stray capacitor produced among these planes will severely eliminate the performance and frequency response of routing trace in a PCB.

Reference is made to FIG. 2, which shows a diagram for an example of the frequency response in a conventional PCB. It is apparent that there is a large-amplitude resonance occurring at 3.9 Ghz, as shown in the diagram, and this will decrease the quality of the circuit structure. In addition, for a PCB using a plurality of power sets, another parasitic resonance occurs at 2.9 GHz. Both conditions at 2.9 GHz and 3.9 GHz described above cause destructive resonance of a PCB in high frequency.

For improving the demerit of prior art, in which a severe resonance effect and parasitic resonance occur in current circuit boards at high frequency, so the present invention discloses a structure including one or a plurality power planes with specific etching holes to promote the quality of the circuit board.

SUMMARY OF THE DISCLOSURE

Broadly speaking, the present invention discloses a structure of a circuit board for improving performance of the routing traces, which are used to eliminate the resonant effect from the layers of the circuit board and improve the routing trace response.

The structure comprises one or a plurality of routing planes on which a plurality of signal traces are disposed; one or a plurality of power planes next to the routing planes; at least one etching hole etched in any shape on one of the power planes; and one or a plurality of ground planes further.

The other embodiment is the structure of the present invention comprises one or a plurality of routing planes, on which there are a plurality of routing traces are mounted; one or a plurality of power planes set on the circuit board and next to the routing planes; one or a plurality of etching slots set on the power planes; and one or a plurality of ground planes.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the following detailed description and the accompanying drawings, which are given by way of illustration only, and thus are not limitative of the present invention, and in which.

DETAILED DESCRIPTION OF THE PREFERRED EMBODIMENTS

Figure 1:
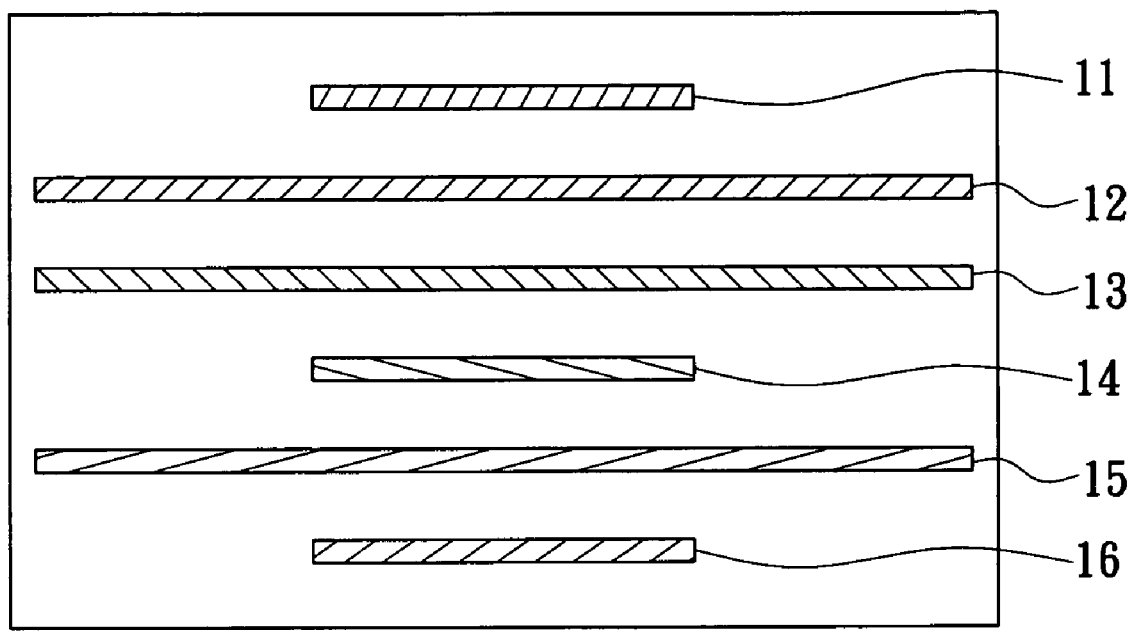
FIG. 1 is a schematic cross-sectional view of a multi-layer PCB of the prior art.
Figure 2:
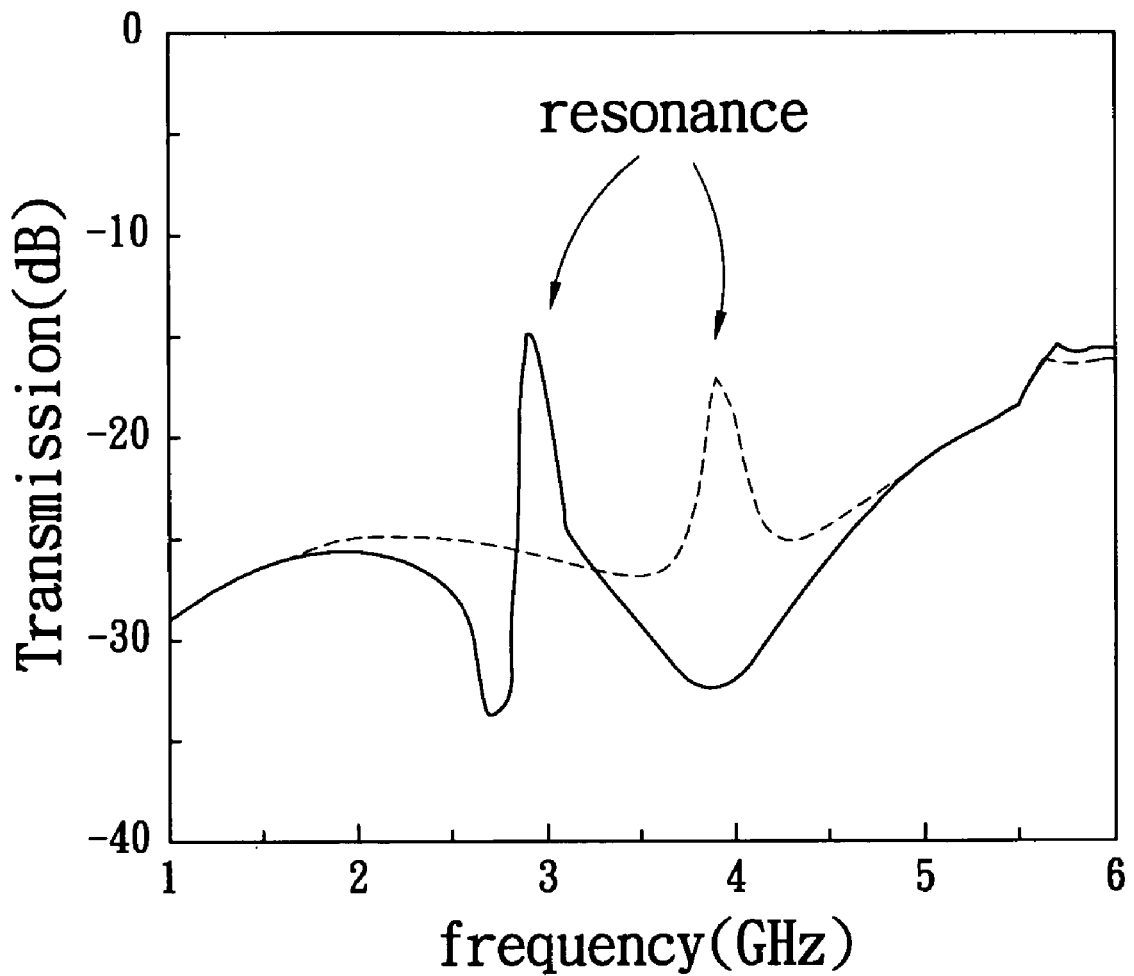
FIG. 2 is a schematic diagram of frequency response produced in a PCB of the prior art.
Figure 3:
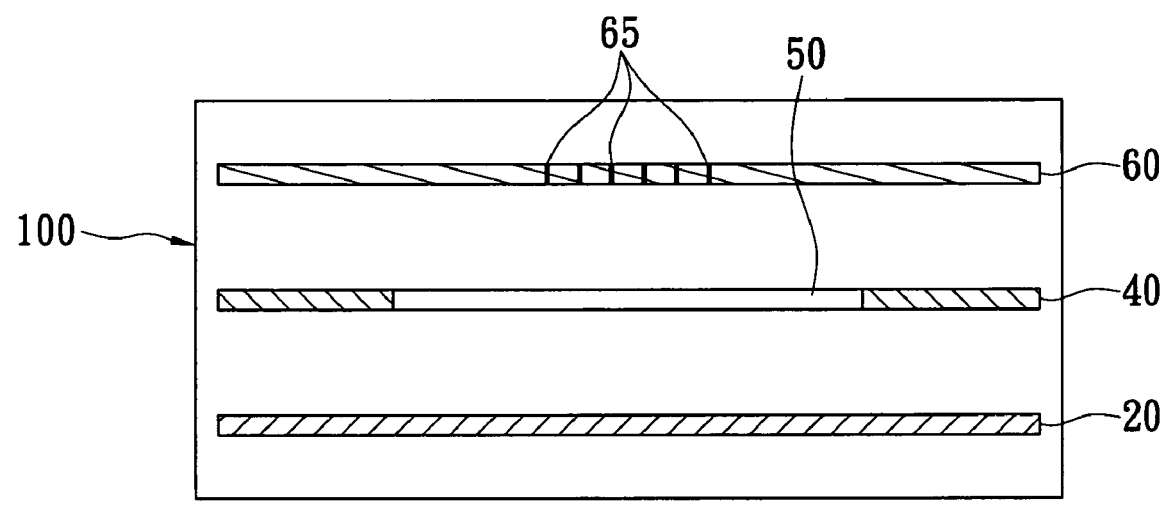
FIG. 3 is a schematic sectional view of the inner structure of the PCB of the present invention.

The main purpose of the present invention is to provide a structure for improving the response of the signal routing traces in a circuit board and eliminating the resonant effects from the layers of a circuit board. FIG. 3 is the cross-sectional view of the inner structure of the circuit board in the invention, in which a multi-layer structure including a ground plane 20, a power plane 40 and a routing plane 60 are installed in the circuit board 100. However, the circuit board 100 further includes a plurality of layers with a device plane and an insulator plane, a dielectric plane and signal plane (not shown in this drawing), and is not limited to elements listed in the description above.

A plurality of routing traces 65 are set on the routing plane 60, and further a power plane 40 is disposed above or under the routing plane 60. The power plane 40 supplies power to circuit board 100. The power plane 40 is set under the routing plane 60 in this embodiment.

For preventing the resonance effect and parasitic resonance between the planes 20, 40 from affecting the routing plane 60 and improving the response of a circuit board 100 in high frequency, the present invention discloses at least one etching hole 50 etched in the power plane 40 with any shape.

After the ground plane 20 and power plane 40 are formed, a resonant cavity effect is produced on account of a stray capacitor formed between the parallel planes and a stray inductance from the decoupling path. Therefore, that defective effect is produced to spoil the response from power plane 40 and the routing plane 60, which is an electric potential reference plane. The method used in the present invention is thus to etch at least one etching hole 50 with any shape on power plane 40 oppositely under the routing trace 65. The method not only reduces the resonance effect and parasitic resonance between the two planes 20, 40 but also gains a better frequency response from routing trace 65 and ground plane 20 as an electric potential reference plane. Moreover, the etching hole 50 etched in power plane 40, which is under the routing trace 65, provides a larger distance between the routing trace 65 and ground plane 20 as a reference plane. The present invention can provide the required characteristic impedance of a routing trace 65 with a wider width and then reduce the difficulty of the manufacturing process as well.

For the same reason, since a resonant cavity effect occurs between the ground plane 20 and power plane 40, at least one etching hole 50 is etched in the power plane 40 in the present invention, which causes the routing plane 60 to refer to the nearest ground plane 20 directly and also to reduce the resonant cavity effect.

Nevertheless, the etching hole 50 can be designed in any shape and the area of the etching hole 50 can cover the signal routing trace 65 partially or completely as needed.

Figure 4:
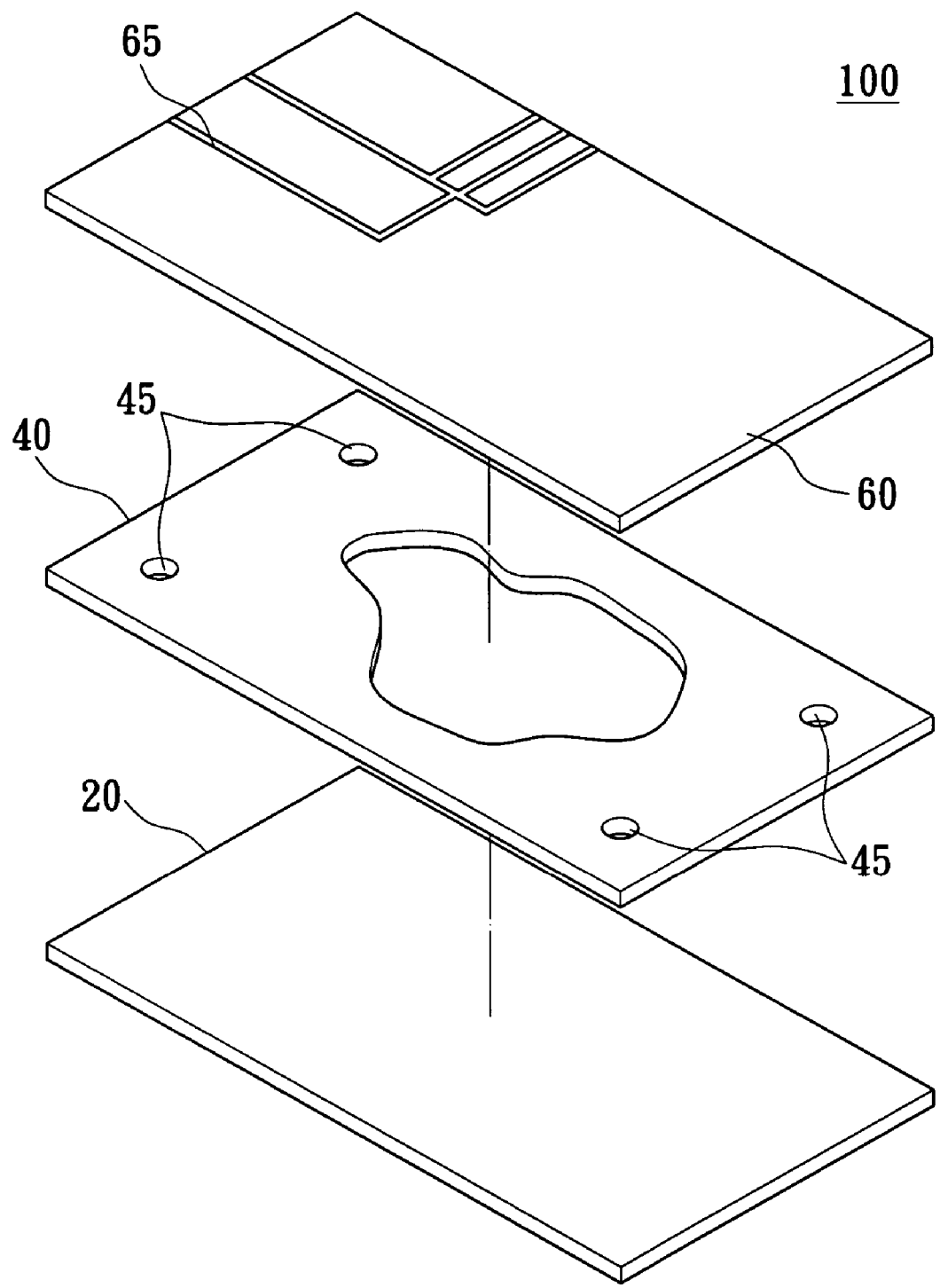
FIG. 4 is a schematic drawing of the first embodiment of the circuit board structure of the present invention.

FIG. 4 shows the first embodiment of the structure of a circuit board 100 in the present invention. The etching hole 50 shown in this drawing covers the above routing trace 65 entirely, in which the routing trace 65 is made of metal fine trace, whose width can be designed or the thickness of electric layer of routing trace 65 can be increased as the characteristic impedance requires. Moreover, the size of area of the etching hole 50 next to the routing plane 60 also can be designed to or not to link with the via hole 45, and the routing plane 60 can connect to the power plane 40 and ground plane 20 via conductive plugs inside these via hole 45. Accordingly, to provide a better frequency response, the invention provides different embodiments for any specific case.

Figure 5:
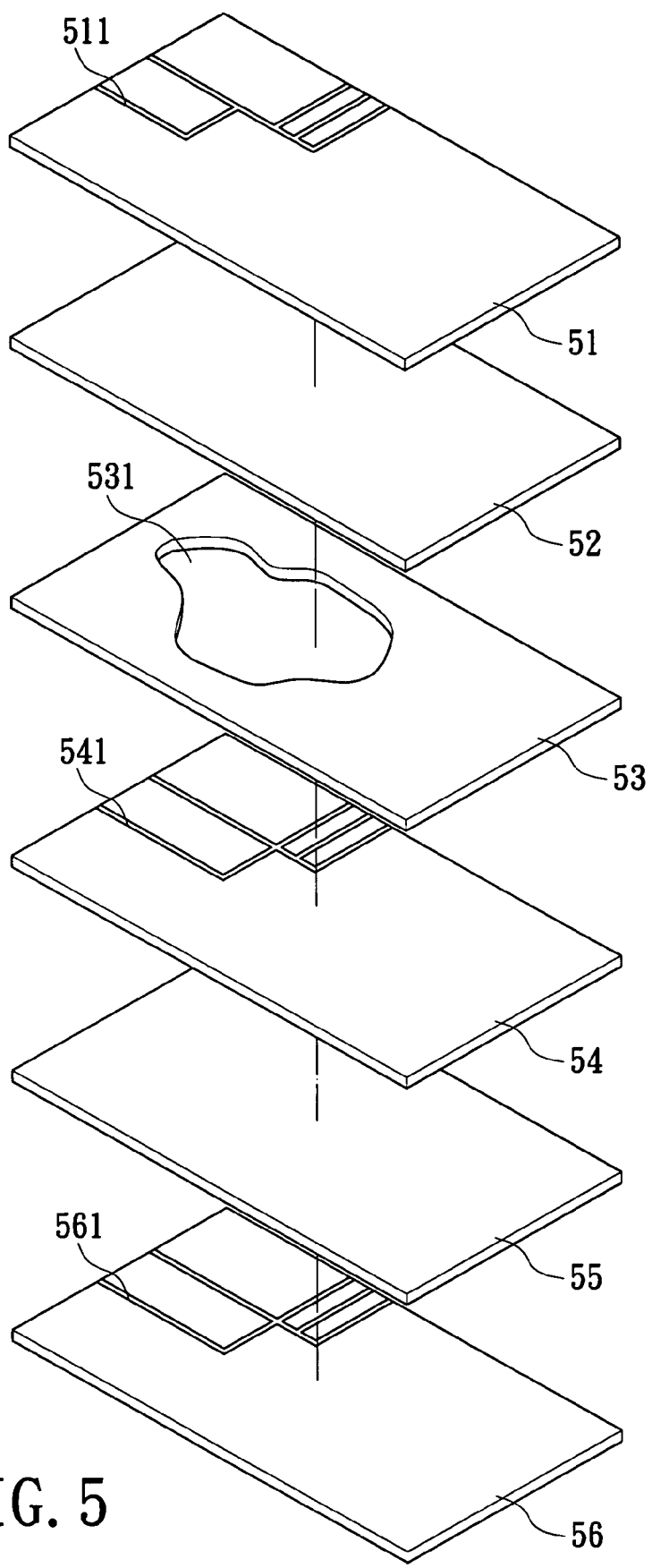
FIG. 5 is a schematic drawing of the second embodiment of a circuit board structure of the present invention.

Since the area of the routing trace on a circuit board is insufficient, the other routing traces should set on the other side or the inner layer of the circuit board as are the six layers shown in FIG. 5, which illustrates the second embodiment of the present invention. The second embodiment includes the first routing plane 51, first ground plane 52, power plane 53, second routing plane 54, second ground plane 55 and third routing plane 56. The routing trace 511, 541 and 561 are set on the routing plane 51, 54, 56. Nevertheless, one or a plurality of etching holes 531 is made in the part of power plane 53 that is entirely or partially covered by the routing trace 541 of the second routing plane 54 for making better electric potential reference to a ground plane, like first ground plane 52 and second ground plane 55, to reduce the influence of routing plane 54 from the resonant cavity formed between the power plane 53 and first ground plane 52.

Figure 6:
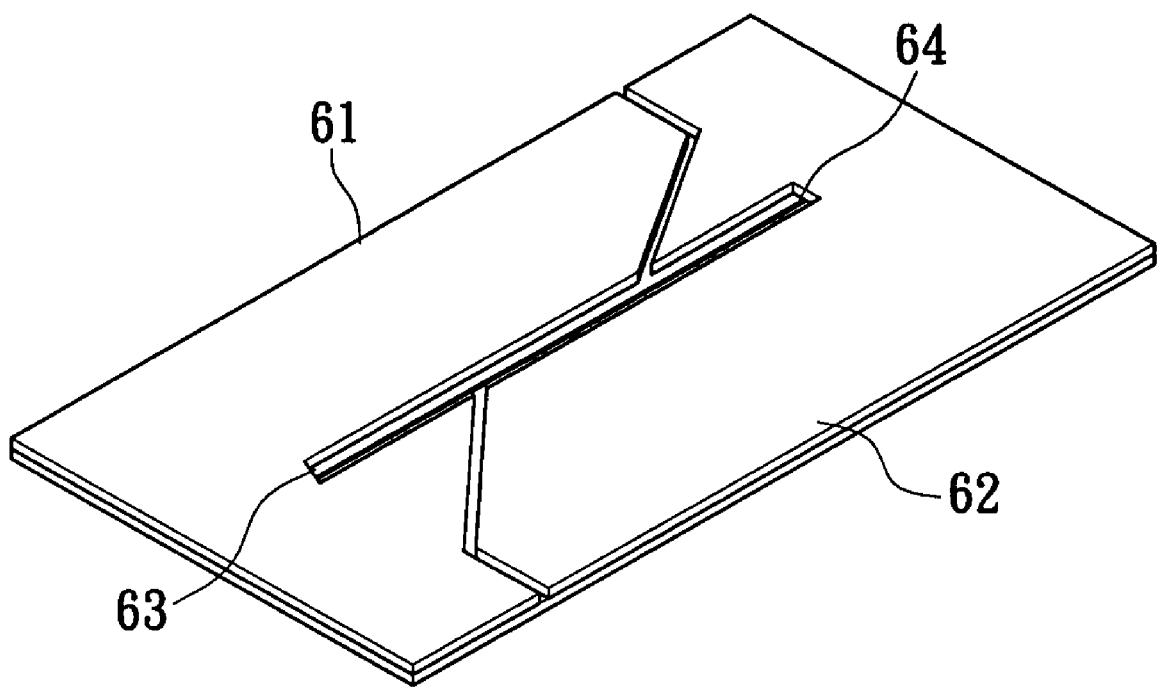
FIG. 6 is a schematic drawing of the third embodiment of a circuit board structure of the present invention.

The third embodiment of the circuit board structure in the present invention is illustrated in FIG. 6. There are probably many power sets with different voltages on power plane, and which are divided into the first power plane 61 and second power plane 62 shown in FIG. 6 by one or a plurality of etching slots 63, especially in the manufacturing process of microchip. Several power sets including first power plane 61 and second power plane 62 on power plane are divided by etching slot 63 with any shape, so the routing trace 64 in the under layer can make electric potential reference to the ground plane. In practice, the width of the etching slot 63 is not five times smaller than the width of the routing trace 64.

Figure 7:
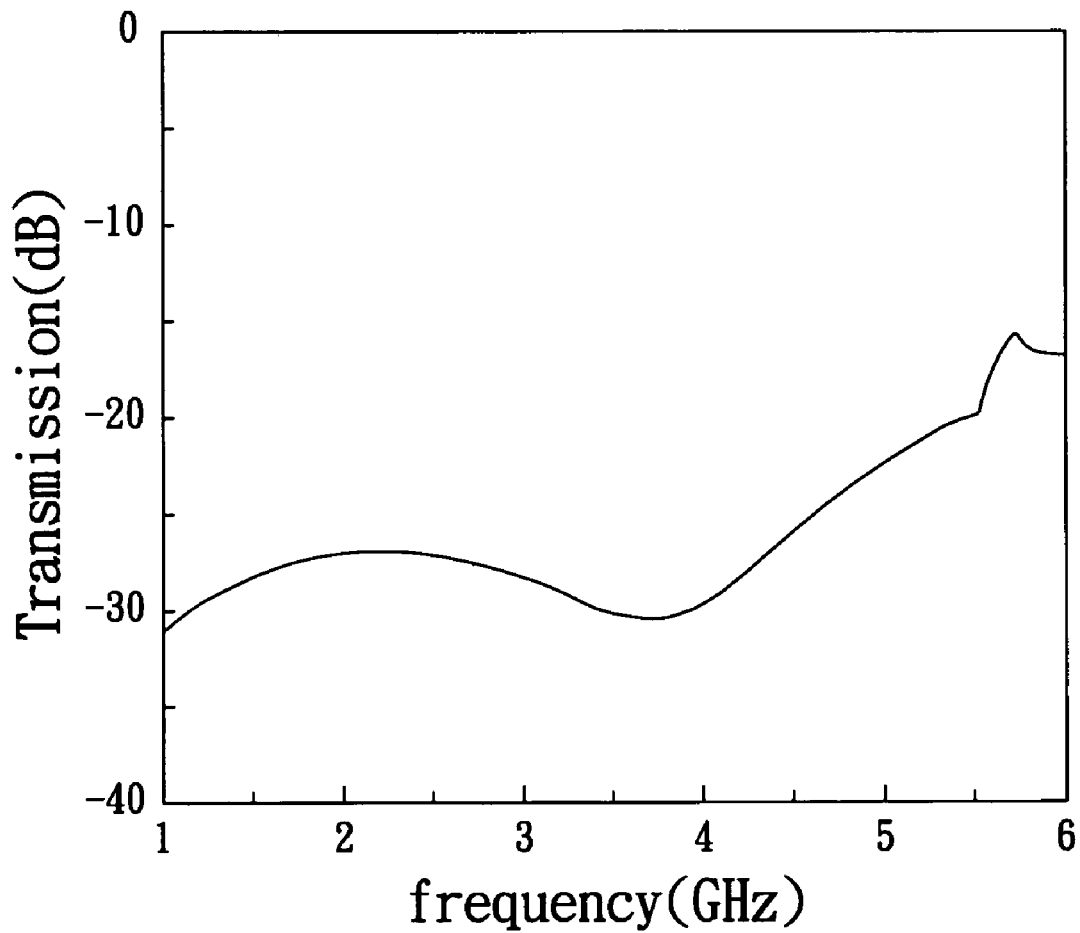
FIG. 7 is schematic diagram of the frequency response of the present invention.

The schematic diagram of the experimental results of the frequency response is shown in FIG. 7, which shows the smoother curve around the previous peaks of 2.9 GHz and 3.9 GHz. It shows the result of effectively reducing the resonance effect and parasitic resonance in the prior art. The structure of a circuit board with an etching hole in the present invention can be used in an IC package with a power plane, like a BGA, for improving routing trace response.

As described in best implementation, the present invention, which relates to structure of a circuit board with an etching hole for improving routing trace response, can be put into use for a printed circuit board (PCB) or IC package substrate with a power plane.

The many features and advantages of the present invention are apparent from the written description above and it is intended by the appended claims to cover all. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A structure of a circuit board for improving the performance of routing traces comprising:
   a ground plane;
   at least one routing plane, on which a plurality of signal routing traces are disposed; and
   at least one power plane located between said routing plane and said ground plane comprising an etching hole with any shape formed therein, wherein said etching hole corresponds to said signal routing traces, total projections of said signal routing traces are completely disposed in said etching hole, causing said routing traces to directly refer to said ground plane.

2. The structure of a circuit board for improving the performance of routing traces as recited in claim 1, wherein said circuit board is a printed circuit board (PCB).

3. The structure of a circuit board for improving the performance of routing traces as recited in claim 1, wherein said circuit board is an IC package substrate.

4. The structure of a circuit board for improving the performance of routing traces as recited in claim 1, wherein said etching hole of said power plane links with a via hole.

5. The structure of a circuit board for improving the performance of routing traces as recited in claim 1, wherein said power plane includes a plurality of power sets with different voltages.

6. A structure of a circuit board for improving the performance of routing traces comprising:
   a ground plane;
   at least one routing plane, on which a plurality of signal routing traces are disposed; and
   at least one power plane next to said routing plane, said power plane is located between said routing plane and said ground plane wherein an etching slot on said power plane corresponds to said signal routing traces, total projections of said signal routing traces are completely disposed in said etching slot, causing said traces to directly refer to said ground plane.

7. The structure of a circuit board for improving the performance of routing traces as recited in claim 6, wherein said circuit board is a printed circuit board (PCB).

8. The structure of a circuit board for improving the performance of routing traces as recited in claim 6, wherein said circuit board is an IC package substrate.

9. The structure of a circuit board for improving the performance of routing traces as recited in claim 6, wherein said etching slot of said power plane links with a via hole.

10. The structure of a circuit board for improving the performance of routing traces as recited in claim 6, wherein said power plane is divided into a plurality of power sets with different voltages by said etching slot.

11. The structure of a circuit board for improving the performance of routing traces as recited in claim 6, wherein a width of said etching slot is at least five times a width of said signal routing trace.

12. The structure of a circuit board for improving the performance of routing traces as recited in claim 1, wherein the size of said etching hole is at least five times the size of said signal routing trace.

* * * * *